US006590461B2

United States Patent
Kawano

(10) Patent No.: US 6,590,461 B2
(45) Date of Patent: Jul. 8, 2003

(54) FREQUENCY CONVERSION APPARATUS AND METHOD

(75) Inventor: Fujio Kawano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,557

(22) Filed: Nov. 9, 2001

(65) Prior Publication Data

US 2002/0057116 A1 May 16, 2002

(30) Foreign Application Priority Data

Nov. 16, 2000 (JP) ....................................... 2000-350111

(51) Int. Cl.[7] ................................................ H03B 1/00
(52) U.S. Cl. ........................................ 331/74; 375/376
(58) Field of Search .............................. 331/74, 57, 45, 331/8, 17, 25, 34; 375/376; 327/156, 157, 158, 159; 455/260

(56) References Cited

U.S. PATENT DOCUMENTS 4,209,800 A * 6/1980 Yamamitsu et al. .......... 386/11
5,920,600 A * 7/1999 Yamaoka et al. ........... 375/376
2001/0006544 A1  7/2001 Kawasaki et al. .......... 375/376

* cited by examiner

Primary Examiner—Robert Pascal
Assistant Examiner—Joseph Chang
(74) Attorney, Agent, or Firm—Fitzpatrick, Cella, Harper & Scinto

(57) ABSTRACT

A frequency converter, generating an output signal having a frequency of coefficient multiple of a reference clock, comprises a variable oscillator for generating a clock group having phase differences obtained by dividing substantially equally output signal period; a main-phase selector for selecting, from the group, a pair of clocks of desired adjacent phases on a first control signal; a sub-phase selector for selecting, from the pair and a clock phase within the phase difference, the one clock on a second control signal; an operation processor for an operation process by two setting data; a logical controller for generating the control signals on the sub-phase selector clock, the operation processor result, and a phase change control signal; a phase comparator for outputting a phase difference signal between the sub-phase selector and reference clocks; and a controller for controlling the variable oscillator on the phase comparator output.

12 Claims, 18 Drawing Sheets

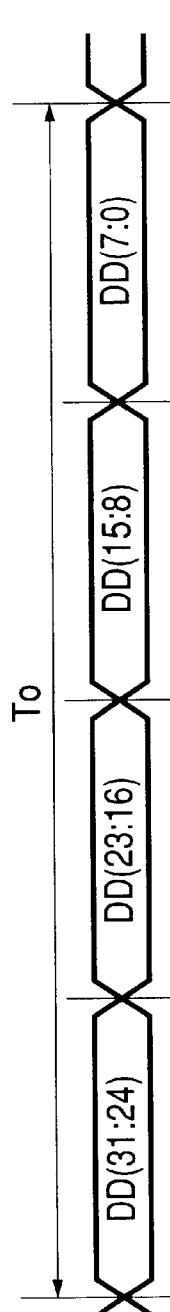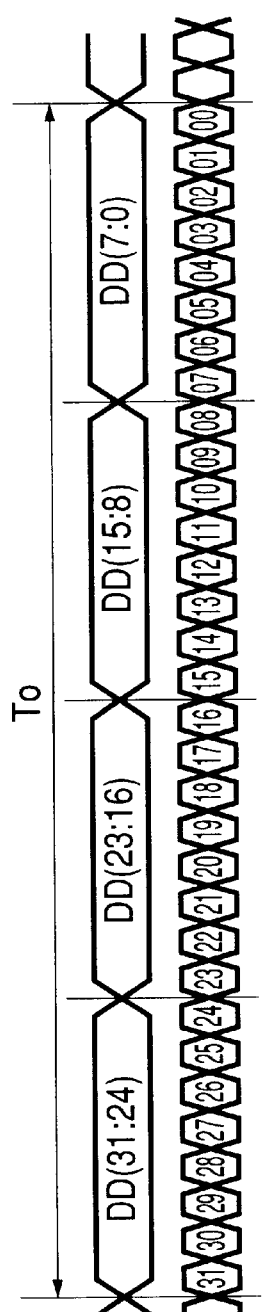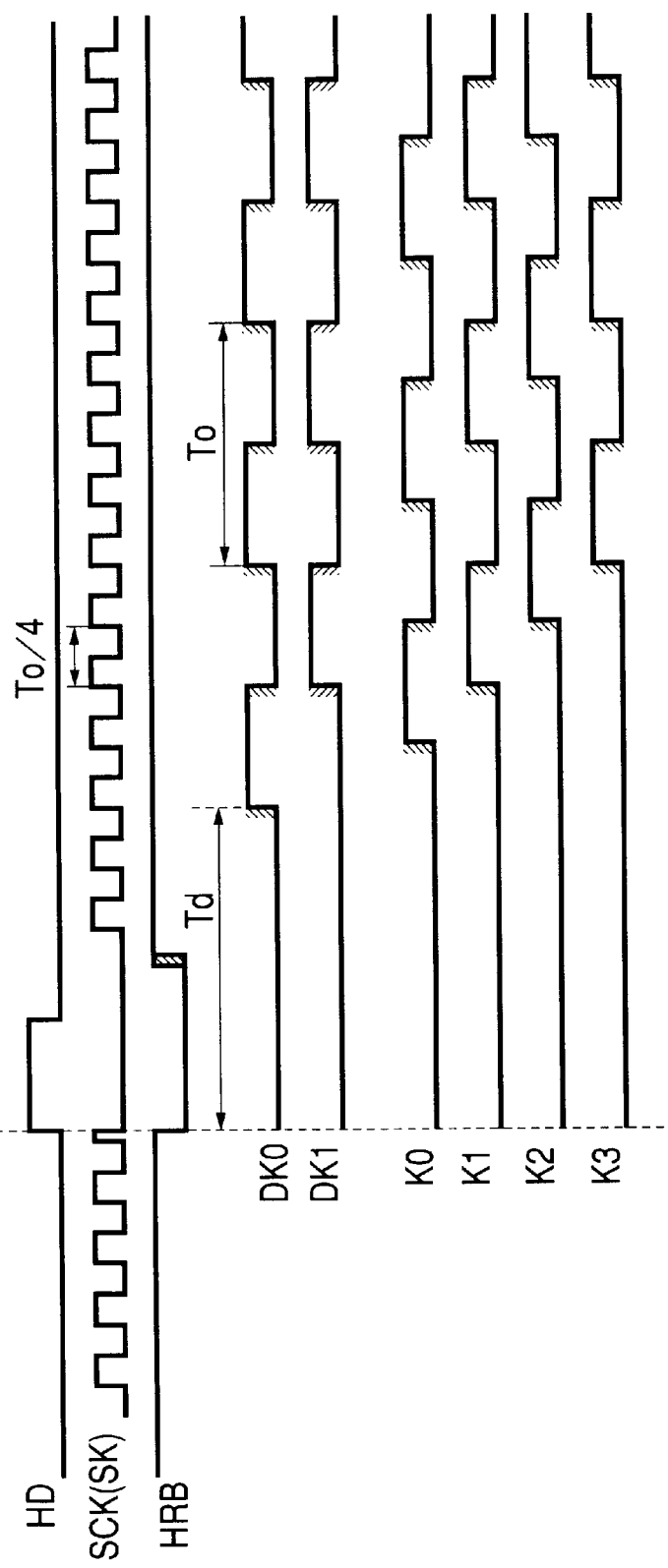
FIG. 7A
FIG. 7B
FIG. 8

FIG. 13

|    | KB | KA |
|----|----|----|
| 0  | K1 | K0 |
| 1  | K1 | K1 |
| 2  | K2 | K1 |
| 3  | K2 | K2 |
| 4  | K3 | K2 |
| 5  | K3 | K3 |
| 6  | K4 | K3 |
| 7  | K4 | K4 |
| 8  | K5 | K4 |
| 9  | K5 | K5 |
| 10 | K6 | K5 |
| 11 | K6 | K6 |
| 12 | K7 | K6 |
| 13 | K7 | K7 |
| 14 | K0 | K7 |
| 15 | K0 | K0 |

FIG. 15

| | s2a | s2b | s2c | s2d | s2e | s2f | s2g | s2h |
|---|---|---|---|---|---|---|---|---|
| A | 8×KA+0×KB | 0 | 0 | 0 | 0 | 0 | 0 | 0 | 0 |
| B | 7×KA+1×KB | 1 | 0 | 0 | 0 | 0 | 0 | 0 | 0 |
| C | 6×KA+2×KB | 1 | 1 | 0 | 0 | 0 | 0 | 0 | 0 |
| D | 5×KA+3×KB | 1 | 1 | 1 | 0 | 0 | 0 | 0 | 0 |
| E | 4×KA+4×KB | 1 | 1 | 1 | 1 | 0 | 0 | 0 | 0 |
| F | 3×KA+5×KB | 1 | 1 | 1 | 1 | 1 | 0 | 0 | 0 |
| G | 2×KA+6×KB | 1 | 1 | 1 | 1 | 1 | 1 | 0 | 0 |
| H | 1×KA+7×KB | 1 | 1 | 1 | 1 | 1 | 1 | 1 | 0 |
| I | 0×KA+8×KB | 1 | 1 | 1 | 1 | 1 | 1 | 1 | 1 |

FREQUENCY CONVERSION APPARATUS AND METHOD

BACKGROUND OF THE INVENTION

1. Field of the Invention

The present invention relates to frequency conversion apparatus and method for generating an output signal of a frequency equivalent to a coefficient multiple of a frequency of a reference clock signal, and more specifically to a frequency synthesizer capable of outputting a high accuracy clock signal (e.g., about 15 ppm) of a frequency equivalent to a coefficient multiple of the input reference clock signal used for pixel position register (or matching) of a color laser print engine.

2. Related Background Art

Although colorization of a laser print engine is strongly requested, generally a process using four-color toners of Ye, Cy, Mg and Bk requires a fourfold print time as compared with a monochrome process. Therefore, it deals with such a problem by using a print engine which uses a four-drum structure containing four photosensitive drums to be used respectively for the four colors and also uses a two-beam laser capable of performing two-line writing at once.

FIG. 1 is a schematic diagram for explaining a four-drum machine. In FIG. 1, photosensitive drums 21a to 21d each of which is dedicated for each of the four colors are disposed in line, and the respective color toners are sequentially transferred to a print sheet 29, whereby a color image is reproduced. An image writing unit shown in FIG. 2 which forms an electrostatic latent image according to a light quantity of a laser beam is provided for each photosensitive drum. Next, an operation of a laser print engine shown in FIG. 2 will be explained.

Explanation of Image Writing Unit

A laser chip 24 of two-beam type contains laser diodes a and b, and a photodiode c receiving each back light.

Driving currents Id1 and Id2 for controlling the respective laser diodes to generate beams are supplied from an LD (laser diode) driver 25. A monitor current Im from the photodiode which detected the light quantity is input to the LD driver 25, whereby APC (automatic power control) for the light quantities of the laser diodes a and b is performed. The laser chip 24 can not set an interval between two laser beam emission points to a one-pixel interval (about 42 μm at 600 dpi) due to its element characteristic. For this reason, as shown in FIG. 3, with respect to a pixel area represented by lattice lines, the laser beam emission points have been obliquely arranged so that two beams are generated at the positions apart from each other by, e.g., 16 pixels along a laser scan direction.

The modulated laser beam generated from the laser chip 24 is polarized by a polygon mirror 19 fixed to a motor shaft and rotated in the direction indicated by the shown arrow, and a photosensitive drum 21 is scanned by the modulated laser beam. An f-θ lens 20 is used to condense the modulated and polarized laser beams onto the photosensitive drum 21 at a constant line speed.

If predetermined electrostatic electrification has been previously performed for the photosensitive drum 21 and print toner, an adhesion quantity of the print toner changes in proportion to the irradiation light quantity on the photosensitive drum 21, whereby a halftone image can be printed. The positional relation between a BD (beam detect) mirror 22 and the photosensitive drum 21 is mechanically fixed, and the reflected laser beam from the BD mirror 22 is input to a light reception diode 23 and used to detect an information writing start position on the photosensitive drum 21. The output from the light reception diode 23 is input to a horizontal sync signal generation circuit 28, thereby generating a horizontal sync signal BD.

The horizontal sync signal BD is input to a pixel modulation circuit 26. The pixel modulation circuit 26 generates a pixel clock synchronizing with the signal BD or a clock equivalent to a coefficient multiple of the pixel clock. Based on the pixel clock, read clocks RK1 and RK2 for reading the pixel data are input to a pixel data generation unit 27. The pixel data generation unit 27 outputs pixel data D1 and D2 and corresponding writing clocks WK1 and WK2 to the pixel modulation circuit 26. Based on the input pixel data, the pixel modulation circuit 26 outputs pixel modulation signals ON1 and ON2 enabling desired laser light quantity modulation to the LD driver 25.

Correspondence of Pixel Modulation Circuit

Since a pixel modulation scale of the above-explained four-drum/two-beam laser print engine is eightfold as compared with that of a conventional one-drum/one-beam laser print engine, it is necessary to make the engine into an LSI. Further, since the four-drum machine has the image writing unit shown in FIG. 2 for each color, it is necessary to perform pixel register for at least three items as follows.

First, it is necessary to correct image position misregister (i.e., out of image position register) caused by a timing error of the signal BD in each image writing unit. This can be electrically achieved up to about 1/32 pixel by controlling a phase (delay) of the pixel clock in the pixel modulation circuit 26.

Next, since the two-beam laser chip 24 has the low-angle oblique arrangement as described above, it is necessary to correct the pixel position because the beam interval changes, as shown in the drawings, due to error and change of the attachment angle thereof. Also, this can be electrically achieved up to about 1/32 pixel by controlling a phase (delay) of the pixel clock based on relative pixel position setting data RP in the pixel modulation circuit 26.

Further, it is necessary to correct an error of image size caused by dispersion of optical machine accuracy occurring in equipments from the laser chip 24, the polygon mirror 19, the f-θ lens 20 to the photosensitive drum 21. This can be achieved based on pixel frequency setting data DF by installing a frequency synthesizer for changing a pixel clock frequency installed in the pixel modulation circuit.

For this reason, pixel position setting data DS (i.e., a signal including the relative pixel position setting data RP, the pixel frequency setting data DF and absolute pixel position setting data RG) for pixel position register is input to the pixel modulation circuit 26 in the image writing unit of FIG. 2.

Pixel Modulation LSI Corresponding to Four-Drum/Two-Beam

FIG. 4 shows a structural example of an LSI system that the pixel modulation circuit 26 equipped with the frequency synthesizer and used for the four-drum/two-beam laser print engine (see FIG. 2) has been made into the LSI. A PLL (phase-locked loop) circuit 32 for generating a pixel clock is composed by the frequency synthesizer.

In FIG. 4, a reference clock CK is input to the PLL circuit 32 also functioning as the frequency synthesizer, and the PLL circuit 32 outputs an eight-phase clock bus K that is fourfold as compared with a pixel clock frequency and each phase is shifted by 1/8 periods (i.e., shifted by 1/32 pixel). Also, the pixel position setting data DS is input to the PLL circuit 32.

The pixel frequency setting data DF in the pixel position setting data DS is used as frequency division setting data in FIG. 5 showing a structural example of the PLL circuit 32. A control current Iv0 of a variable frequency oscillation (VCO) circuit 6 included in the PLL circuit 32 and generating an eight-phase clock is output from the PLL circuit 32. The horizontal sync signal BD is input to a BD delay circuit 30 and thus delay-controlled based on the pixel position setting data DS.

The control current Iv0 is input to the BD delay circuit 30 which includes a structure that delay circuits equivalent to the variable delay circuit used in the variable frequency oscillation circuit 6 of the PLL circuit 32 are cascaded, and the signals BD of which timings are mutually shifted by 1/32 pixel are output from the connection points of the delay circuits.

Fine adjustment bits of the absolute pixel position setting data RG included in the pixel position setting data DS and used to set the pixel positions among the drums are used to perform the delay control to obtain the desired signal BD in the BD delay circuit 30, whereby the pixel position register among the drums can be finely adjusted up to 1/32 pixel.

The output signal BD is input to a horizontal sync signal separation circuit 31, and thus separated into a horizontal sync signal HD1 for an antecedent laser and a horizontal sync signal HD2 for a succedent laser as shown in FIG. 6.

The horizontal sync signals HD1 and HD2 are respectively input to a sync clock generators 33a and 33b together with the eight-phase clock bus K output from the PLL circuit 32. The sync clock generators 33a and 33b generate sync clock signals SCK1 and SCK2 in synchronism with the input signals HD1 and HD2, respectively. The sync accuracy of each clock signal is 1/32 pixel.

The sync accuracy in the one-drum/one-beam machine is enough by about 1/8 pixel, however, color misregister (i.e., out of color register) in the four-drum/two-beam machine directly causes color moire and changes a color tone, and thus a request for a sync clock generator characteristic is high.

Since gradation reproduction of an image is important in case of the color laser print engine, PWM pixel modulation is generally used. Further, to flexibly cope with a digital image process, the modulation is performed by dividing a pixel (To) into 32 parts as shown in FIG. 7B.

However, the pixel data of 32 bits for one beam are huge and unachievable. For this reason, the pixel data D1 and D2 are input as six-bit data to 32-bit expansion data decoders 35a and 35b together with the corresponding writing clocks WK1 and WK2, respectively. Each of the data decoders 35a and 35b is, e.g., a 64-address/32-bit SRAM, and the data to be stored therein has been previously set to a desired value by a user.

The output 32-bit data from the data decoders 35a and 35b are subjected to serial conversion as shown in FIG. 8. For example, if it is assumed that the pixel frequency is 25 MHz (40 ns), an extremely high-accuracy signal process in which the modulation accuracy is 1.25 ns is required, and the pixel frequency shows a tendency to further increase. The sync clocks SCK1 and SCK2 and signals HRB1 and HRB2 output from the sync clock generators 33a and 33b are input to time base circuits 34a and 34b, respectively.

The time base circuit 34b includes the structure that variable delay circuits equivalent to the variable delay circuit used in the VCO circuit 6 of the PLL circuit 32 are cascaded, a pixel clock shifted from others by 1/32 pixel is generated at each connection point, and the beam interval can be high-accurately adjusted based on the relative pixel position setting data RP in the input pixel position setting data DS. Further, in the time base circuits 34a and 34b, the upper bits of the absolute pixel position setting data RG are used for coarse adjustment in the pixel position register among the drums.

FIG. 8 shows contents of output signal buses K1 and K2 of the time base circuits 34a and 34b.

Clocks DK0 and DK1 are used as reading timing clocks of SRAM in the data decoders 35a and 35b, respectively. The buses K0 to K3 are input to (32→8) bit data conversion circuits 36a and 36b respectively, and then converted into eight-bit data DV shown in FIG. 19. If it is assumed that a time Td includes a time resulted in by the BD delay circuit 30 and each of the setting data RG and RP is the five-bit data, the clock delay time shown in FIG. 8 is represented by the following expressions.

$$Td1 = Td(0) + RG(4:0) \times (To/32)$$

$$Td2 = Td(0) + RG(4:0) \times (To/32) + RP(4:0) \times (To/32)$$

As understood from the above expressions, the phases of the pixel data DV1 and DV2 can be controlled in the accuracy of 1/32 pixel. If the data modulation is finally performed at this timing, desired image modulation can be achieved. The eight-bit data DV1 and DV2 of the (32→8) bit data conversion circuits 36a and 36b are input to modulation circuits 37a and 37b together with sync clocks SK1 and SK2, respectively.

Each of the modulation circuits 37a and 37b includes a delay chain circuit that variable delay circuits equivalent to the variable delay circuit used in the VCO circuit 6 of the PLL circuit 32 are cascaded, and has the structure to generate the eight-phase clock which is controlled so that each delay quantity becomes 1/32 pixel by DLL (delay-locked loop) control, whereby 32-bit serial modulation signals ON1A and ON2A shown in FIG. 7B can be generated.

The 32-bit serial modulation signals ON1A and ON2A are input to pulse width addition circuits 38a and 38b, respectively.

The laser diode does not emit light at once due to a luminescence principle even if a current is supplied, but emits light with delay. The laser diode stops emitting light at once if the current is interrupted.

FIGS. 9A and 9B show operations of the pulse width addition circuits 38a and 38b. When a pixel modulation driving current shown in FIG. 9A is supplied to the laser, a light emission period is reduced (narrowed) as shown in FIG. 9B. The laser does not emit light if a narrow pulse is supplied as shown at a point P2, whereby normal luminescence control can not be achieved.

To solve such the problem, if a pulse width of a predetermined period is added to each pixel modulation pulse as shown in FIG. 9C, desired light emission pulses can be obtained as shown in FIG. 9D.

The pulse width addition circuits 38a and 38b respectively include variable delay circuits equivalent to the respective variable delay circuits used in the modulation circuits 37a and 37b, and control currents Iv1 and Iv2 in the modulation circuits 37a and 37b are input to the circuits 38a and 38b respectively.

Thus, the pulse width is added by generating a coefficient current, and high-accuracy control of less than 1/100 pixel is achieved stably.

Pixel modulation signals ON1B and ON2B output from the pulse width addition circuits 38a and 38b are input to output drivers 39a and 39b respectively, and the pixel modulation signals ON1 and ON2 are then output to the LD driver 25.

Since high accuracy of less than 1ns is required for the pulse width accuracy of the pixel modulation pulse signal, a circuit of small signal differential output type is used. The above-explained pixel modulation circuit can be achieved in an LSI process of CMOS (complementary mental-oxide semiconductor).

Conventional Frequency Synthesizer

For example, in a 600 dpi machine, since an image size error of about 16 pixels occurs in a size of about 8000 pixels, a pixel frequency control range of about ±0.2% (2000 ppm) is necessary. Further, high-accuracy pixel frequency control of about 15 ppm accuracy is necessary to suppress the image size error to about ⅛ pixel.

FIG. 5 shows a conventional example of the frequency synthesizer.

In FIG. 5, a reference clock signal Kr of a frequency fr is input to a stationary frequency division circuit 13 of a frequency division number Nr, and then input as a reference signal R to a phase comparison circuit 15. On the other hand, an output signal Kv of a frequency fv from a variable oscillation circuit 18 of which frequency changes based on a driving control signal output from a control signal generation circuit 17 is input to a variable frequency division circuit 14, and a comparison signal V frequency-divided by a frequency division number Nv and output from the circuit 14 is then input to the phase comparison circuit 15. Here, the frequency division number Nv is variable according to the setting data DF. An up-pulse U (down-pulse D) generated when the comparison signal V delays (advances) from the reference signal R is output from the phase comparison circuit 15 and then input to a charge pump circuit 16.

An error voltage is generated based on the up-pulse U and the down-pulse D in the charge pump circuit 16 and then input to the control signal generation circuit 17, and output control is performed so that the phase of the comparison signal V matches with that of the reference signal R. The following relation is established in the above-explained frequency synthesizer.

$$fv = (Nv/Nr) \times fr \quad (1)$$

As above, the clock signal Kv having the frequency fv equivalent to the coefficient multiple of the reference clock frequency fr can be output.

The frequency synthesizer is defined by a frequency variable range and frequency setting accuracy.

Here, the following conditions are considered.

frequency variable range: about ±2000 ppm frequency setting accuracy: about 15 ppm $$1/216 = 1/65536 = 15.25 \text{ ppm} \quad (2)$$

$$(65536)/(65536-128) = +1953 \text{ ppm} \quad (3)$$

$$(65536-256)/(65536-128) = -1957 \text{ ppm} \quad (4)$$

From the expressions (2) to (4), the variable frequency division circuit 13 can be designed as follows by way of example, whereby the frequency synthesizer can be achieved.

the number of counter bits: 16 bits frequency division number setting data DF: 8 bits frequency division number range: 65280 to 65408 to 65536

However, when the frequency setting accuracy of the above-explained frequency synthesizer is increased, it is necessary to increase the frequency division number of the variable frequency division circuit. This means that a frequency check interval of the output signal Kv is increased, whereby it is necessary to structure the variable oscillation circuit 18 to be able to stably maintain the oscillation frequency during tens of thousands of clocks as in this case. Further, to stably maintain the oscillation frequency, it is necessary to stably control the oscillation output signal by not only the variable oscillation circuit 18 but also the charge pump circuit 16 using a capacitor of a large capacity unachievable by the LSI, even if attack/recovery ability is sacrificed.

However, the above-explained conventional frequency synthesizer has the following problems.

Problem 1

According to an increase of the frequency setting accuracy, the frequency stability of the variable oscillation circuit 18 becomes necessary. The variable oscillation circuit 18 capable of maintaining the frequency stability over tens of thousands of clocks could not be achieved easily in a general-purpose LSI process alone, whereby such the frequency stability could not be concretized with less cost.

Problem 2

According to the increase of the frequency setting accuracy, it is necessary to stably control the oscillation output signal by the charge pump circuit 16 using the large-capacity capacitor. For this reason, the attack/recovery ability is sacrificed, and thus a rapid output frequency change can not be performed, whereby an application range had been limited.

SUMMARY OF THE INVENTION

In consideration of the above background, an object of the present invention is to provide frequency conversion apparatus and method which can stably generate an output signal having a frequency equivalent to a coefficient multiple of a frequency of a reference clock signal, can perform a rapid output frequency change, and can be achieved with less cost.

In order to attain the above-described object according to one aspect of the present invention, there is provided a frequency conversion apparatus which generates an output signal having a frequency equivalent to a coefficient multiple of a frequency of a reference clock signal, comprising: a variable oscillation means for generating a group of clock signals having phase differences obtained by dividing substantially equally a period of the output signal; a main-phase selection means for selecting and outputting, from the group of the clock signals, a pair of the two clock signals of desired adjacent phases on the basis of a first control signal; a sub-phase selection means for selecting and outputting, from the pair of the clock signals and a clock phase within the phase difference of these signals, the one clock signal on the basis of a second control signal; an operation processing means for performing an operation process by using two frequency setting data; a logical control means for generating the first and second control signals on the basis of the clock signal selected by the sub-phase selection means, the operation result of the operation processing means, and a phase change control signal; a phase comparison means for outputting a phase difference signal representing a phase difference between the clock signal selected by the sub-phase selection means and the reference clock signal; and a control means for controlling the variable oscillation means on the basis of the phase difference signal output by the phase comparison means.

Further, according to another aspect of the present invention, there is provided a frequency conversion method which generates an output signal having a frequency equivalent to a coefficient multiple of a frequency of a reference clock signal, comprising: a variable oscillation step of generating a group of clock signals having phase differences obtained by dividing substantially equally a period of the output signal; a main-phase selection step of selecting and outputting, from the group of the clock signals, a pair of the two clock signals of desired adjacent phases on the basis of a first control signal; a sub-phase selection step of selecting and outputting, from the pair of the clock signals and a clock phase within the phase difference of these signals, the one clock signal on the basis of a second control signal; an operation processing step of performing an operation process by using two frequency setting data; a logical control step of generating the first and second control signals on the basis of the clock signal selected in the sub-phase selection step, the operation result of the operation processing step, and a phase change control signal; a phase comparison step of outputting a phase difference signal representing a phase difference between the clock signal selected in the sub-phase selection step and the reference clock signal; and a control step of controlling the clock signal generation in the variable oscillation step on the basis of the phase difference signal output in the phase comparison step.

Other objects, features and advantages of the present invention will become apparent from the following detailed description taken in conjunction with the accompanying drawings.

BRIEF DESCRIPTION OF THE DRAWINGS

FIGS. 7A and 7B are timing charts for explaining a pixel modulation method;

FIG. 8 is a timing chart for explaining an operation of a time base circuit;

FIG. 13 is a diagram for explaining an operation of a main-phase selection circuit shown in FIG. 10;

FIG. 15 is a diagram for explaining the operation in FIG. 13;

DETAILED DESCRIPTION OF THE PREFERRED EMBODIMENTS

Figure 1:
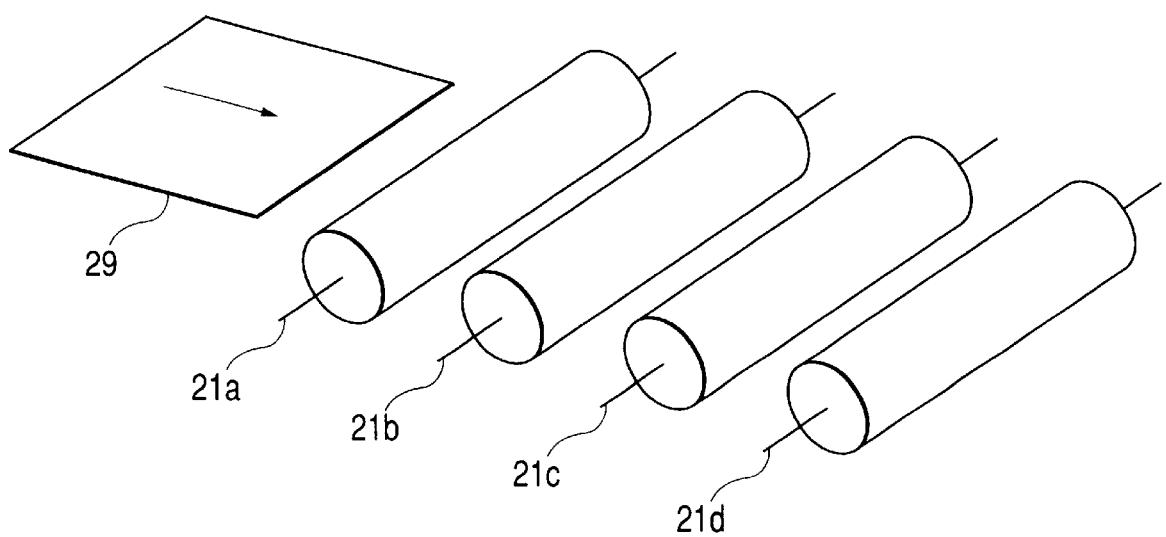
FIG. 1 is a schematic diagram for explaining a four-drum machine.
Figure 2:
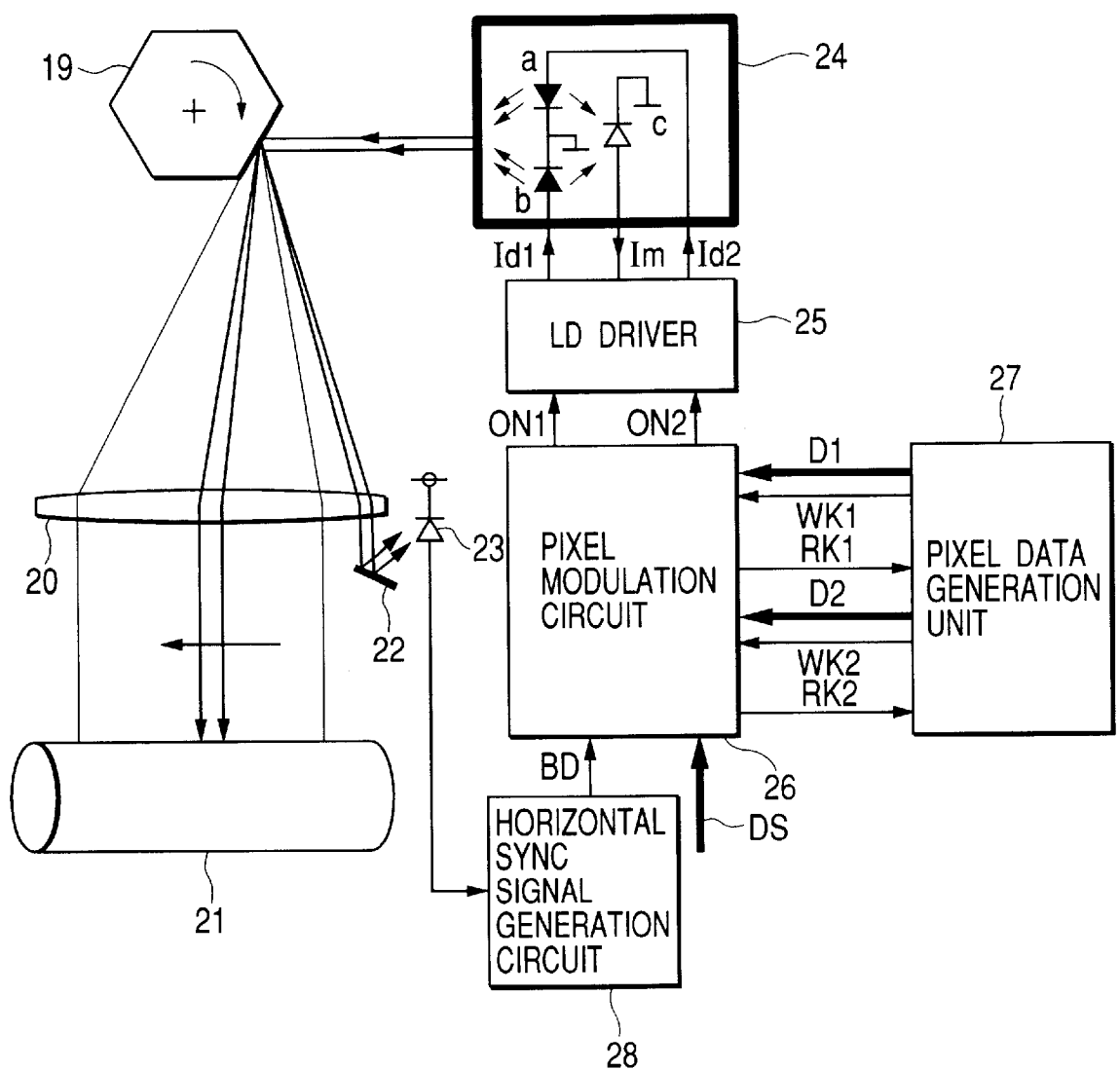
FIG. 2 is a block diagram showing a structure of a laser print engine.
Figure 3:
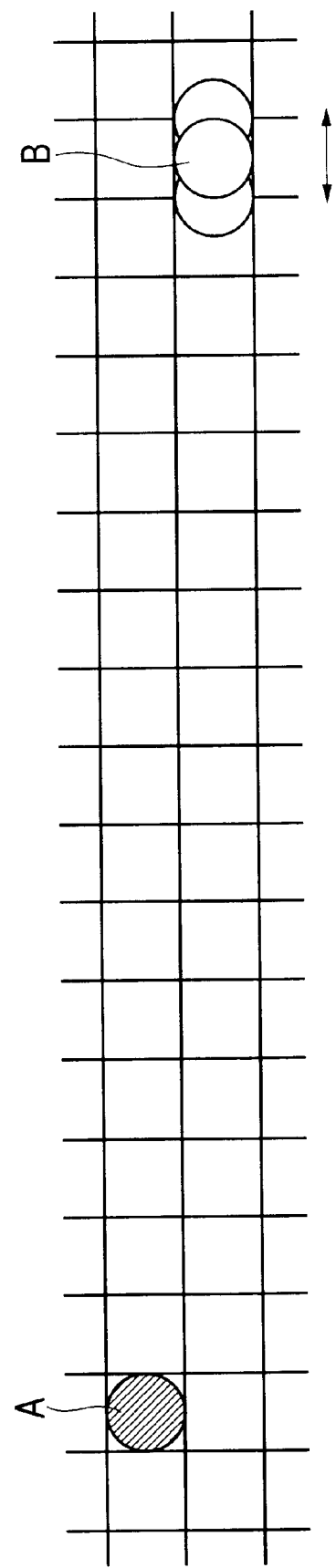
FIG. 3 is a diagram showing a conception of beam arrangement of a two-beam laser.
Figure 4:
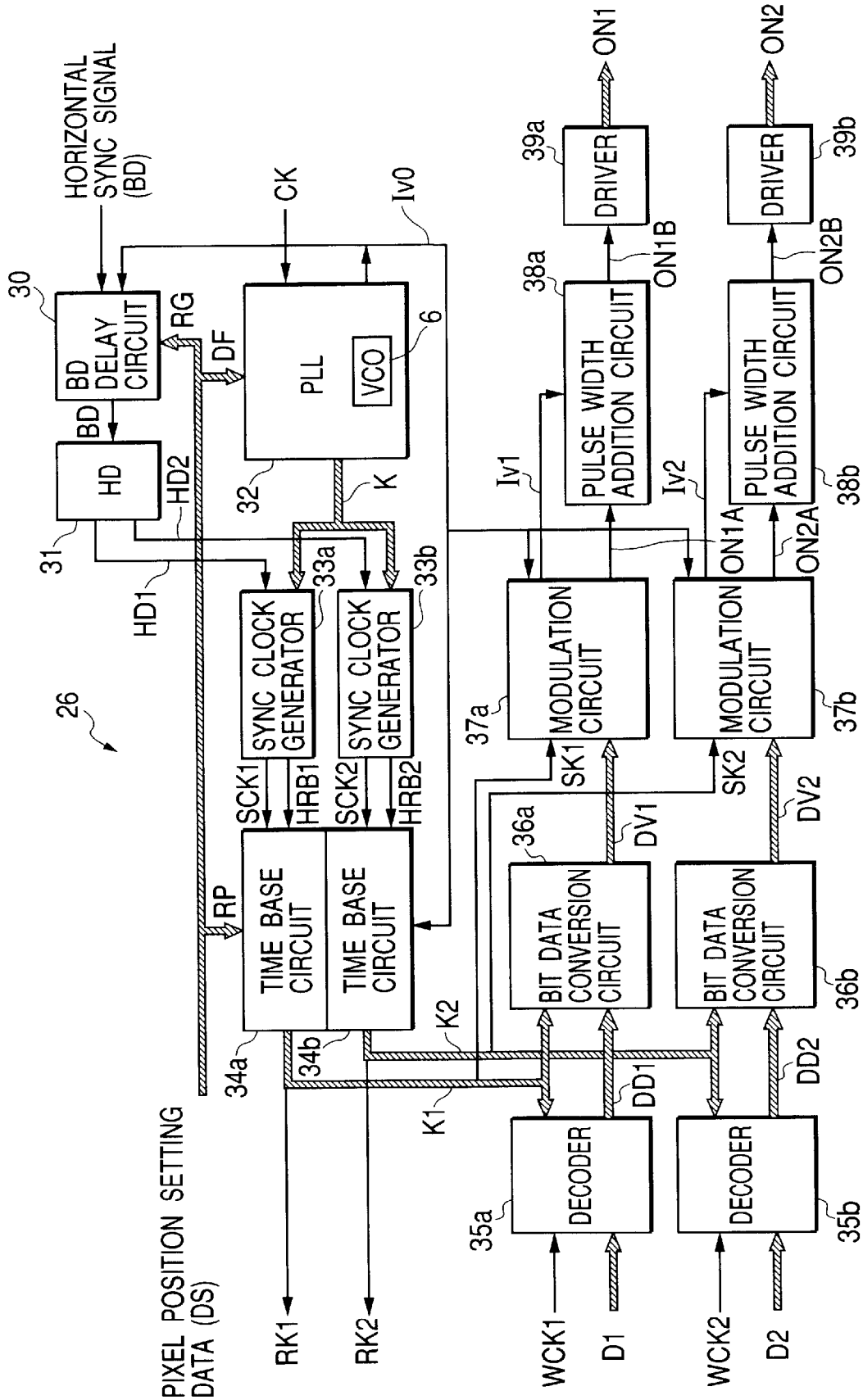
FIG. 4 is a block diagram showing a pixel modulation LSI for a four-drum/two-beam laser print engine.
Figure 5:
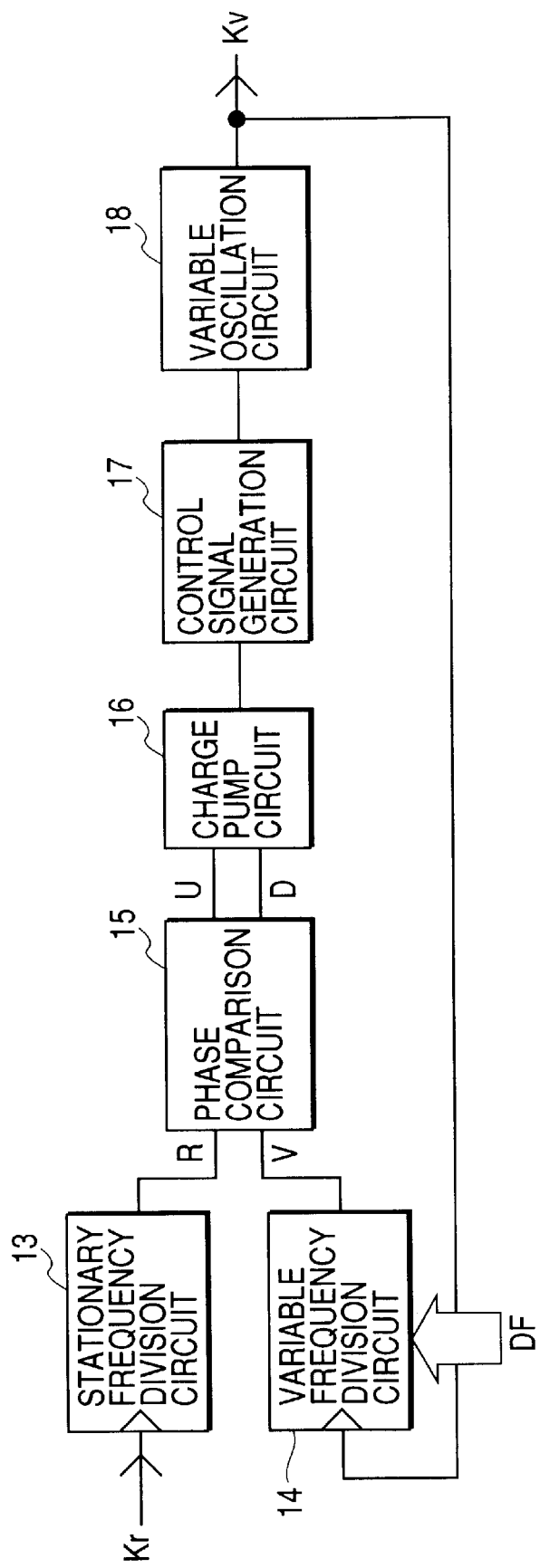
FIG. 5 is a block diagram showing a conventional frequency synthesizer.
Figure 6:
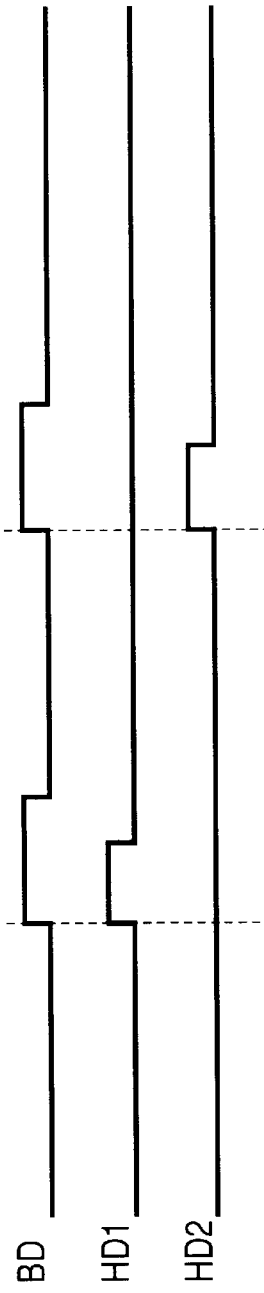
FIG. 6 is a timing chart for explaining a horizontal sync signal separation circuit.
Figure 9:
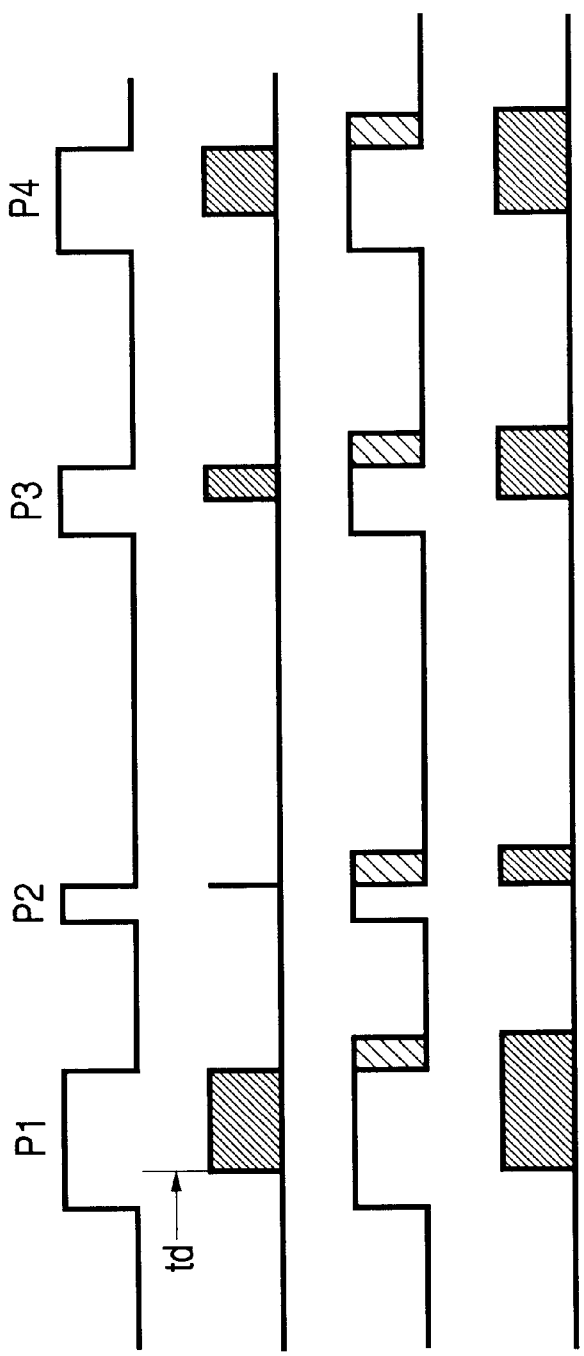
FIGS. 9A, 9B, 9C and 9D are timing charts for explaining an operation of a pulse width addition circuit.
Figure 10:
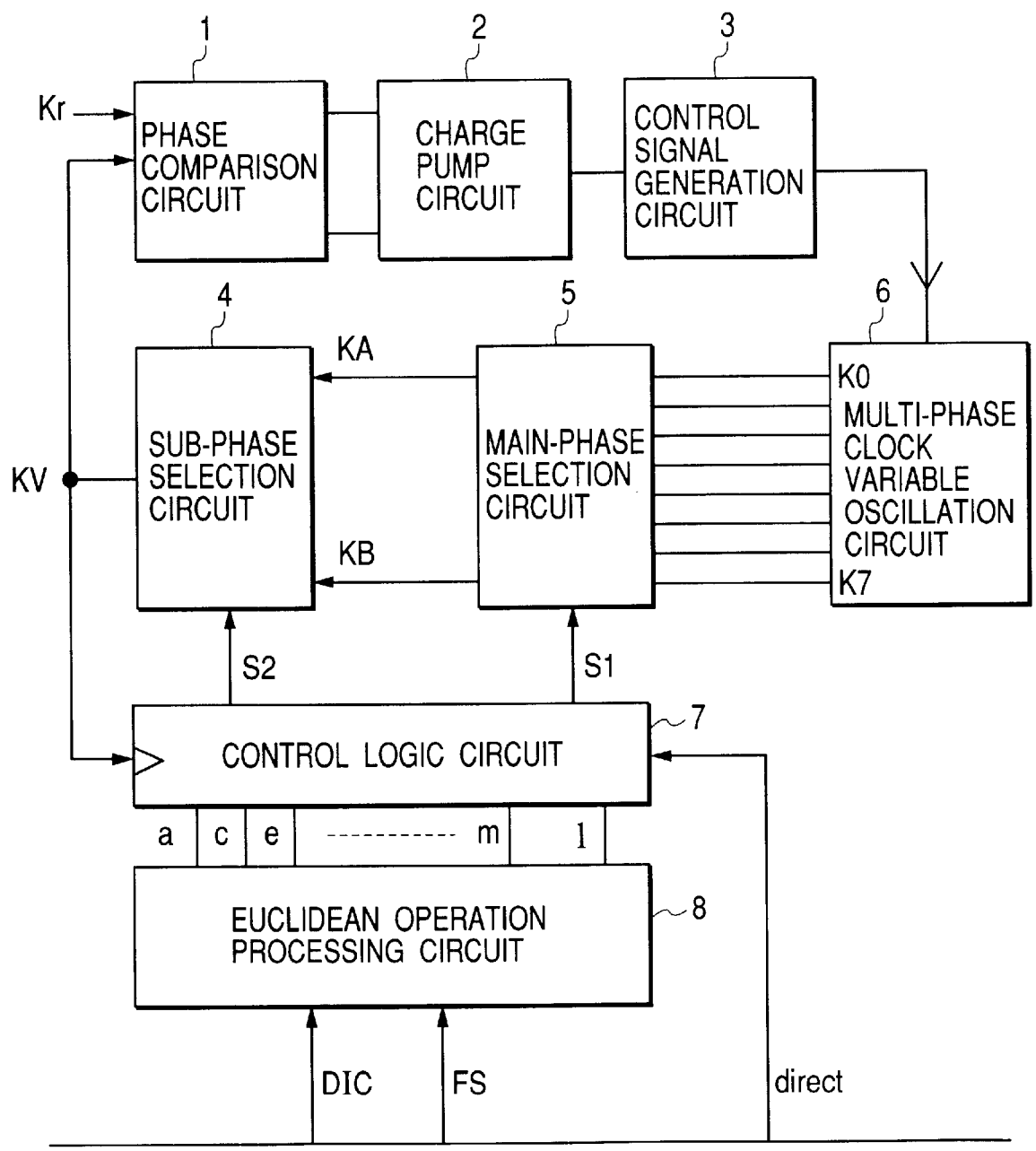
FIG. 10 is a block diagram showing a structure of a frequency synthesizer according to the embodiment of the present invention.

FIG. 10 shows a frequency synthesizer according to the embodiment of the present invention.
Explanation of Structure A reference clock signal Kr is input to a general phase comparison circuit 1 generating an up-pulse U and a down-pulse D, as it is. Of course, the reference clock signal Kr may be a signal obtained by frequency-dividing or multiplying an original clock signal according to the need.

The output pulse of the phase comparison circuit 1 is also input to a general charge pump circuit 2, and an error voltage is generated from the charge pump 2 and also input to a general control signal generation circuit 3, whereby a control voltage Vc is output.

Figure 11:
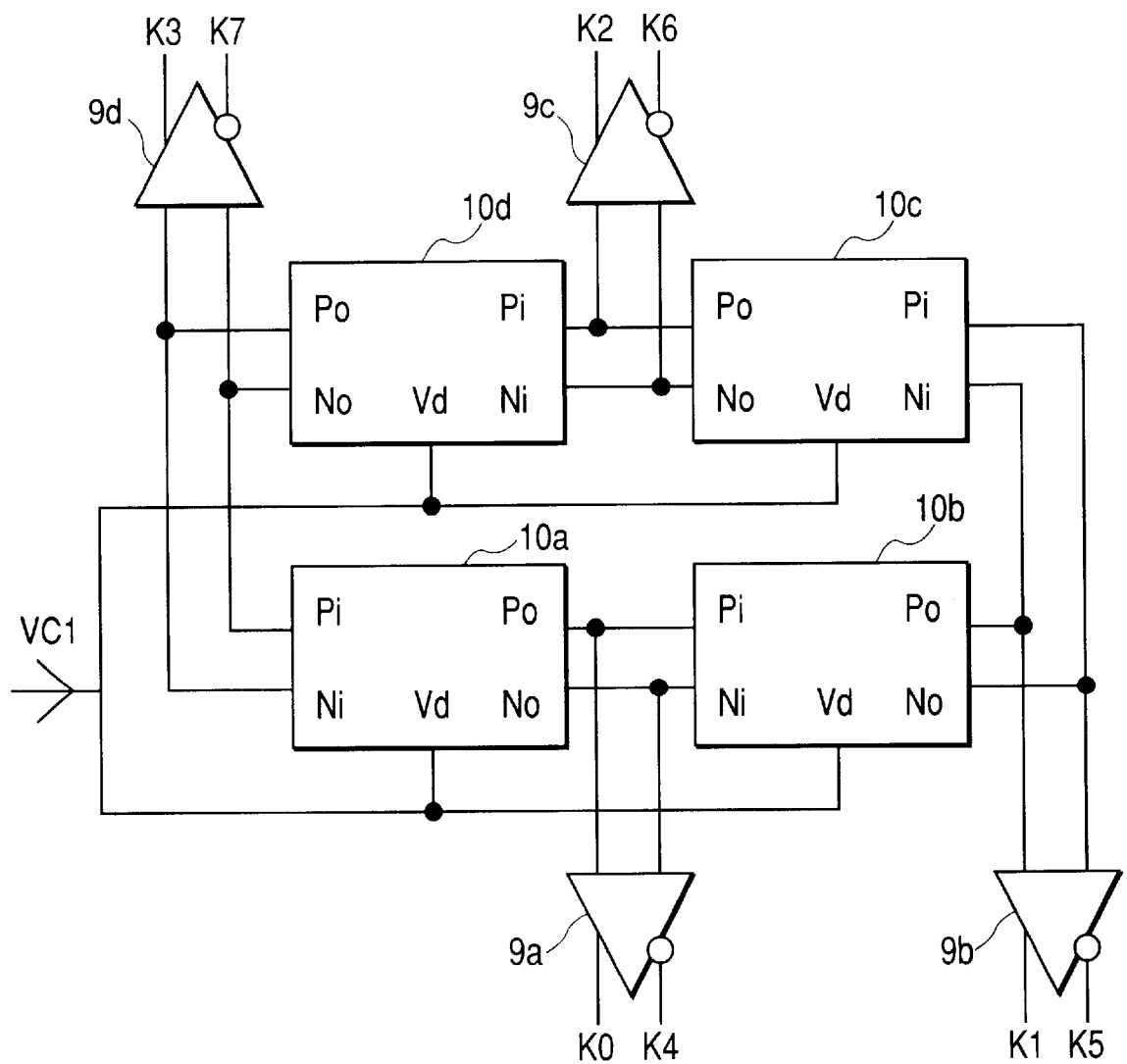
FIG. 11 is a block diagram showing a structure of a variable oscillation circuit shown in FIG. 10.

The control voltage Vc is input to a multi-phase clock variable oscillation circuit 6 of which structural example is shown in FIG. 11, whereby oscillation frequencies of multi-phase clock signals K0 to K7 are controlled.

The multi-phase clock signals K0 to K7 constitute a group of clock signals having timing obtained by dividing an oscillation clock period into eight. The multi-phase clock signals K0 to K7 are input to a main-phase selection circuit 5, and two main selection clocks KA and KB are output from the circuit 5 in response to a phase selection signal S1.

Next, the clocks KA and KB are input to a sub-phase selection circuit 4, and a comparison signal Kv is output from the circuit 4 in response to a phase selection signal S2. The comparison signal Kv is input to the phase comparison circuit 1 and also input to a control logic circuit (cont) 7 (also called a logical control circuit 7) as a clock signal.

A minimum resolution setting data DIC and resolution setting data FS are input to a Euclidean operation processing circuit 8, and the logical control circuit 7 outputs the phase selection signals S1 and S2 on the basis of operation results a, c, e, . . . , m, and 1 and a phase change control signal "direct", thereby controlling the main-phase selection circuit 5 and the sub-phase selection circuit 4.
Explanation of Multi-Phase Clock Variable Oscillation Circuit FIG. 11 shows a structural example of the multi-phase clock variable oscillation circuit 6.

In FIG. 11, differential delay circuits 10a to 10d all having the same structure are connected like a ring. However, when an output differential signal of the differential delay circuit 10d is input to the differential delay circuit 10a, these circuits are connected so that positive and negative electrodes between these circuits are differentiated mutually, thereby structuring the oscillation circuit.

Figure 12:
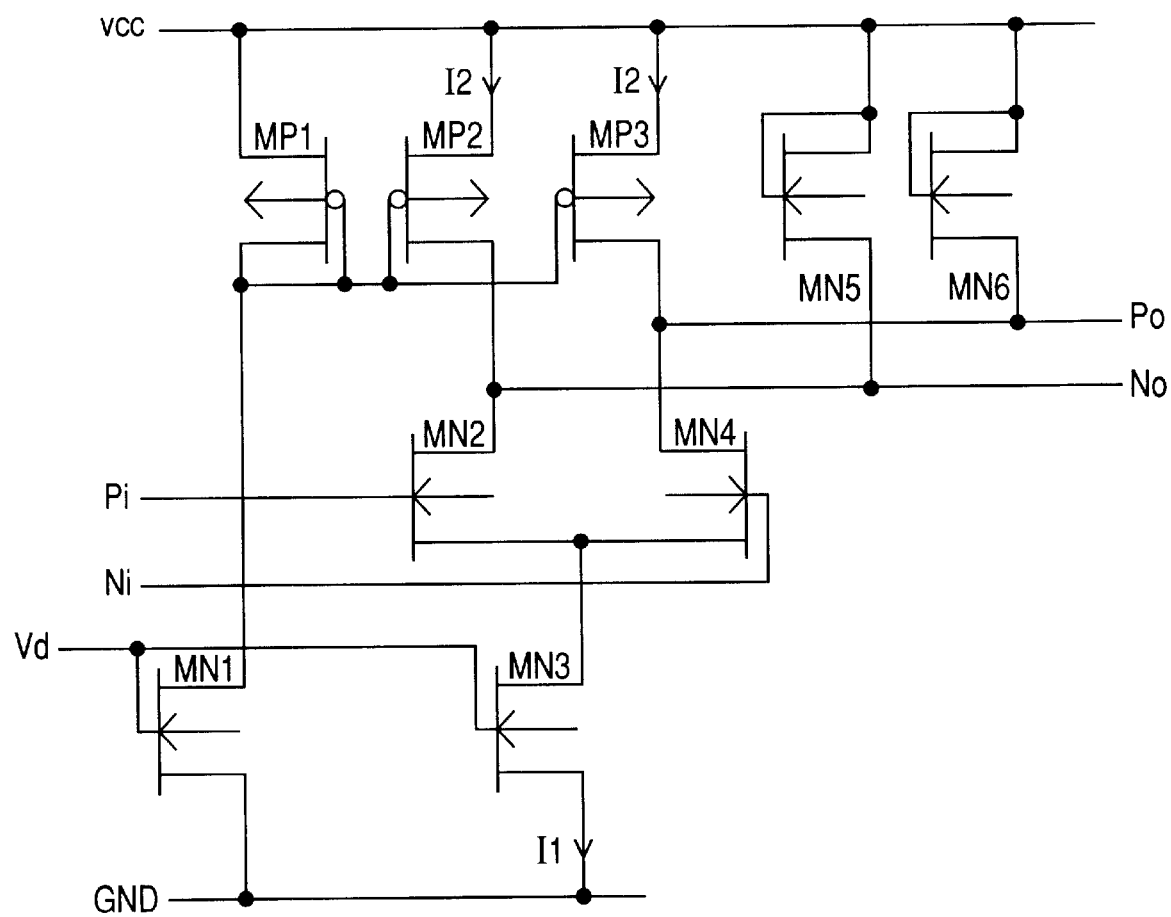
FIG. 12 is a block diagram showing a circuit structure of a differential delay circuit shown in FIG. 11.

A CMOS circuit structural example of the differential delay circuit is shown in FIG. 12.

In FIG. 12, a driving voltage Vd is input to parts MN1/G and MN3/G. A drain current I1 of the part MN3 is connected to a source couple of parts MN2 and MN4. A positive electrode signal Pi and a negative electrode signal Ni are input to the parts MN2/G and MN4/G respectively.

The part MN1/D is input to a gate-drain short circuit of parts MP1/D, MP2/G and MP3/G. The parts MP2/D and MP3/D both outputting a current I2 are connected to the parts MN2/D and MN4/D respectively, and also connected to a gate-drain short circuit of parts MN5/S and MN6/S, thereby outputting a positive electrode signal Po and a negative electrode signal No.

If I2=I1/2, charge and discharge are performed by the current I2 in each of transition periods of the signals Po and No. Since the current I2 is determined by the driving voltage Vd, input/output delay times can be controlled resultingly.

Therefore, the delay time of each differential delay circuit is ⅛ of an oscillation period Tv. An oscillation frequency fv can be controlled by setting a control voltage Vc to be the control voltage Vd of each of the differential delay circuits 10a to 10d. Differential output signals of the differential delay circuits 10a to 10d are output to differential buffers 9a to 9d, whereby multi-phase clock signals K0 to K7 each having a phase different from others by ⅛ period can be output.

The above-explained multi-phase clock variable oscillation circuit 6 can be easily structured in an LSI by a CMOS process.

Explanation of Main-Phase Selection Circuit

The output signals KA and KB of the main-phase selection circuit 5 to which the multi-phase clock signals K0 to K7 are input have 16 states on the basis of the phase selection signal S1, as shown in FIG. 13. Here, the output signals KA and KB are assumed to be differential clock signals. The feature of the differential clock signals is that, with respect to both the signals KA and KB, the output clock does not change for the two state numbers, and the clock number changes by two in the successive state number. Further, it is assumed that, based on the phase selection signal S1, a sequential operation is performed as follows:

the state 0→the state 15 the state 15←the state 0

Explanation of Sub-Phase Selection Circuit

Figure 14:
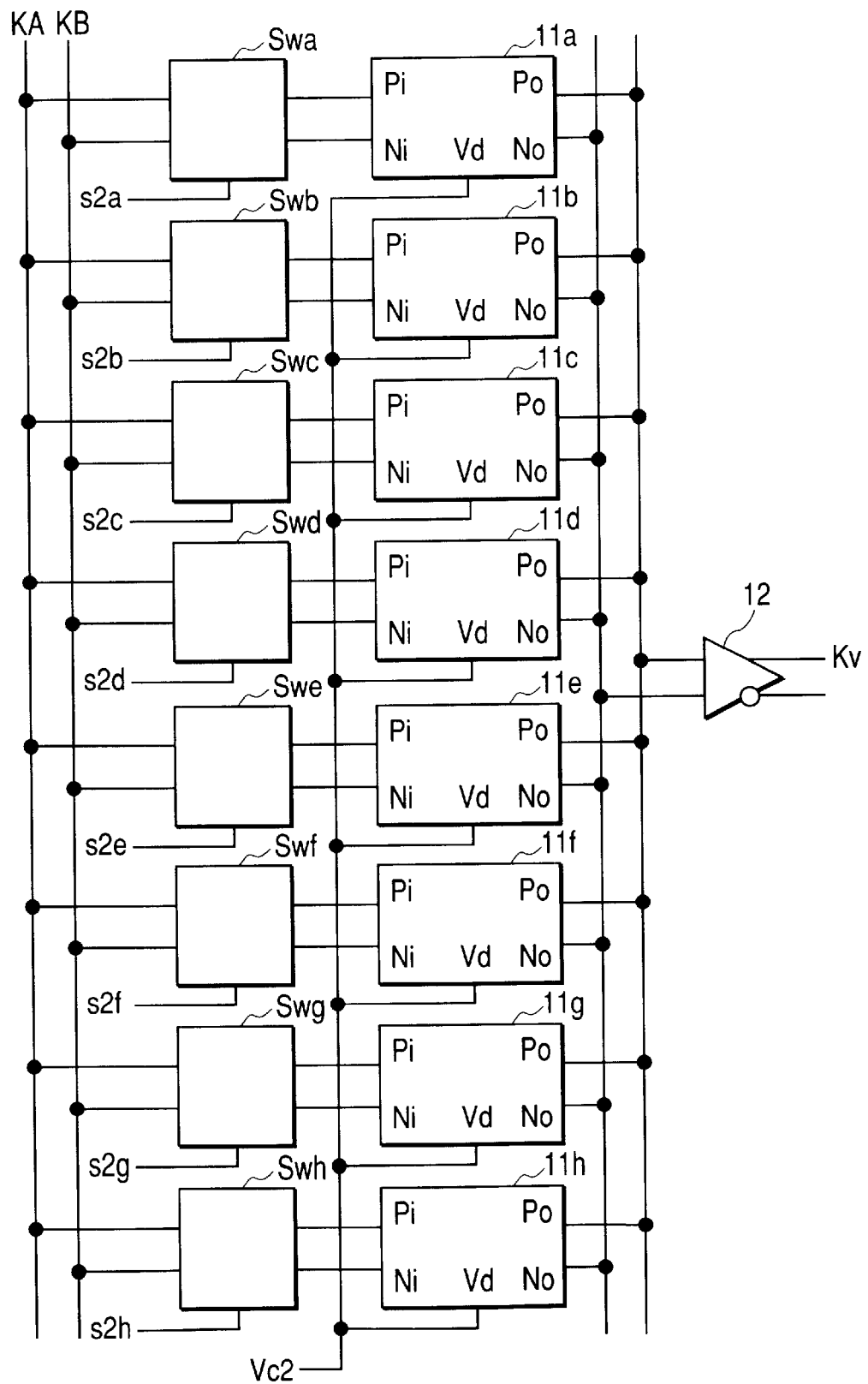
FIG. 14 is a block diagram showing a structural example of a sub-phase selection circuit shown in FIG. 10.

FIG. 14 shows a structural example of the sub-phase selection circuit 4 to which the differential clock signals KA and KB are input.

In FIG. 14, the signals KA and KB are input to selection circuits Swa to Swh respectively. Signals s2a to s2h together composing a phase selection signal S2 are input to the selection circuits Swa to Swh respectively, whereby the differential clock signal KA (KB) is selected at a time of L (H) level.

The output differential signals of the selection circuits Swa to Swh are input to differential delay circuits 11a to 11h respectively. For example, each differential delay circuit has the same structure as that of the differential delay circuit used in the variable oscillation circuit 6 shown in FIG. 12.

A control voltage Vc2 may be the same as a control voltage VC1 of the variable oscillation circuit 6, whereby a new control circuit need not be provided. The differential output terminals of the differential delay circuits 11a to 11h are mutually connected, whereby a comparison clock signal Kv is output through a differential buffer 12.

The comparison clock signal Kv has nine states A to I respectively represented by state equations as shown in FIG. 15, and these states are set based on selection signals s2a to s2h.

Figure 16:
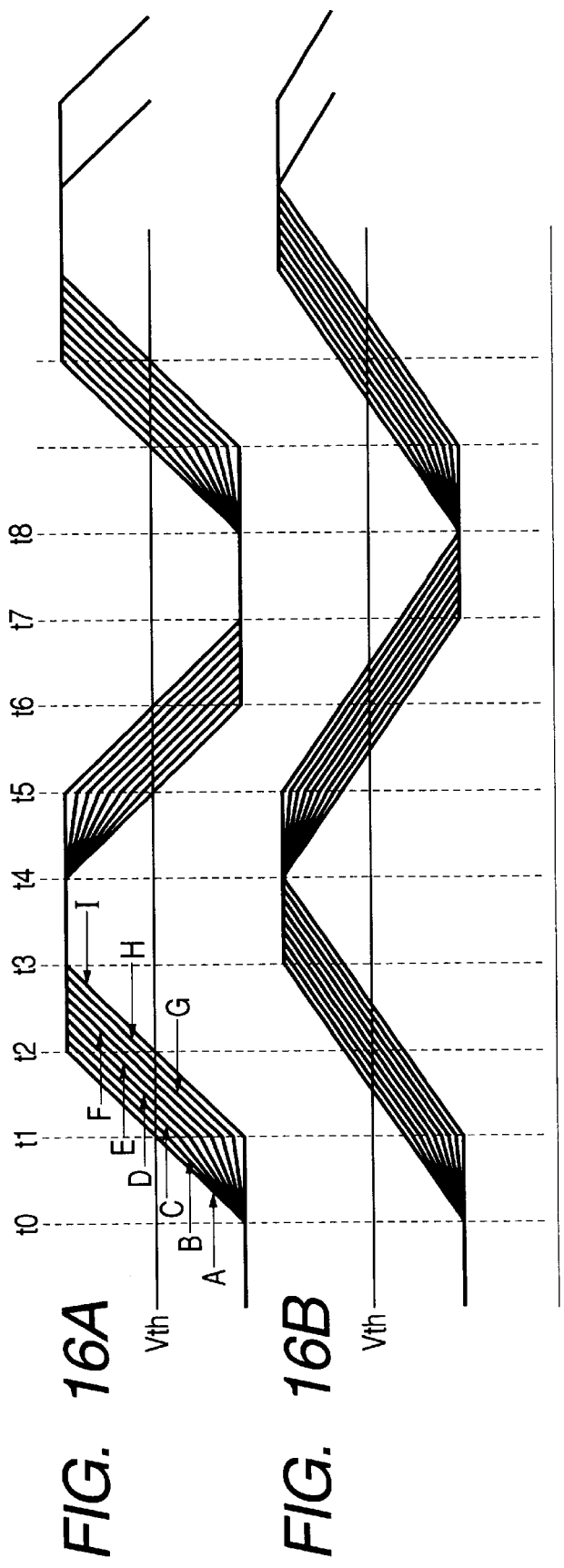
FIGS. 16A and 16B are waveform charts for explaining the operation in FIG. 13.

FIG. 16A shows waveforms at the output connection points of the differential delay circuits 11a to 11h again by the differential signals.

The state A is the state that the phase most advances, and the charge/discharge is performed at the current (16×I2) in the transition area (period t0 to t2 and period t4 to t6). However, since a parasitic capacity is about eightfold, voltage increase and decrease speed is substantially the same as that of the output signal of the differential delay circuit in the variable oscillation circuit 6, and the transition time is about ¼ of the clock period Tv.

In the state B, the charge/discharge current is (15−1)×I2= 14×I2 in the periods t0 to t1 and t4 to t5, and thereafter the charge/discharge current is 8×I2 until a voltage transition ends when exceeding a threshold voltage Vth.

In the state C, the charge/discharge current is (14−2)×I2= 12×I2 in the periods t0 to t1 and t4 to t5, and thereafter the charge/discharge current is 8×I2 until the voltage transition ends when exceeding the threshold voltage Vth.

In the state D, the charge/discharge current is (13−3)×I2= 10×I2 in the periods t0 to t1 and t4 to t5, and thereafter the charge/discharge current is 8×I2 until the voltage transition ends when exceeding the threshold voltage Vth.

In the state E, the charge/discharge current is (12−4)×I2= 8×I2 in the periods t0 to t1 and t4 to t5, and thereafter the charge/discharge current is 8×I2 until the voltage transition ends when exceeding the threshold voltage Vth.

In the state F, the charge/discharge current is (11−5)×I2= 6×I2 in the periods t0 to t1 and t4 to t5, and thereafter the charge/discharge current is 8×I2 until the voltage transition ends when exceeding the threshold voltage Vth.

In the state G, the charge/discharge current is (10−6)×I2= 4×I2 in the periods t0 to t1 and t4 to t5, and thereafter the charge/discharge current is 8×I2 until the voltage transition ends when exceeding the threshold voltage Vth.

In the state H, the charge/discharge current is (9−7)×I2= 2×I2 in the periods t0 to t1 and t4 to t5, and thereafter the charge/discharge current is 8×I2 until the voltage transition ends when exceeding the threshold voltage Vth.

The state I is the state that the phase most delays, and the charge/discharge is performed at the current (8×I2) in the transition area (period t1 to t3 and period t5 to t7). The phase of the state I is delayed by ⅛ of the clock period Tv as compared with the state A.

By the above operation, charge/discharge waveforms in the transition area of the respective states are given as shown in FIG. 16A, whereby it is possible in the states A to I to output the clock signals of which phases are different from others by 1/64 of the clock period Tv (i.e., the clock signals having equally divided phases). FIG. 16B shows operation waveforms of the respective states in a case where the parasitic capacities at the output connection points of the differential delay circuits 11a to 11h have grown relatively more than the variable oscillation circuit 6 by about 50% on layout. It is understood that even in such the case the phase equal-division operation is satisfactorily performed, whereby the above-explained operation can be achieved.

It is difficult to stably operate the differential delay circuit with its delay time 0.5 ns or less, and the multi-phase clock signal of more than eight phases can not be output by the variable frequency oscillation circuit 6 if the clock frequency exceeds 200 MHz.

The above-explained sub-phase selection circuit easily achieves a fine clock phase which could not be achieved by the variable frequency oscillation circuit 6, by a logical interpolation process.

Explanation of Pre-Scaler Operation: Control Logic Circuit 7 and Euclidean Operation Processing Circuit 8 in FIG. 10

Explanation of Euclidean Operation Processing Circuit 8

The Euclidean operation processing circuit 8 is a Euclidean algorithm operation circuit which obtains a greatest common divisor of two input signals, i.e., frequency setting data FS and minimum resolution setting data DIC.

(a) DIC/FS=a . . . b (b) FS/b=c . . . d (c) b/d=e . . . f (w) wh/j=k . . . l (x) xj/l=m . . . 0

As above, in the first operation expression (a), the data DIC is divided by the data FS to calculate the quotient a and the remainder b. In the operation expression (b), the divisor FS of the expression (a) is divided by the remainder b of the expression (a) to calculate the quotient c and the remainder d like the expression (a). Then, the divides from the expression (c) to the expression (x) are performed, and the operation process ends when the remainder finally becomes 0.

Explanation of Logical Control Circuit 7

In the result obtained by the Euclidean operation processing circuit 8, the logical control circuit 7 performs logical control by using the quotients (a, c, . . . , k, m) of the expressions (a), . . . , (x) and the remainder (1 in the expression (w)) of the expression immediately before the expression by which the remainder becomes 0.

Hereinafter, the logical control will be explained in detail with reference to FIG. 17.

Symbols ● and ○ in the drawing indicate the states of the control signal for the clock signal Kv input to the logical control circuit 7, i.e., ● indicates the state that holds the previous phase information, and ○ indicates the state that outputs the phase control signal to change the phase to a next phase. In FIG. 17, for example, when the state that the phase state is A(a) is ●, the state transition A(a)→B(b) occurs based on the clock signal Kv. The phase change control signal "direct" input to the logical control circuit 7 is the signal for determining the direction of the phase transition such as A(a)→B(b), B(b)→A(a), or the like.

In each state (I, II, . . . ), the sum of ○ and ● is equal to the value of the minimum resolution setting data DIC, and the sum of ● is equal to the value of the resolution setting data FS.

Figure 17:
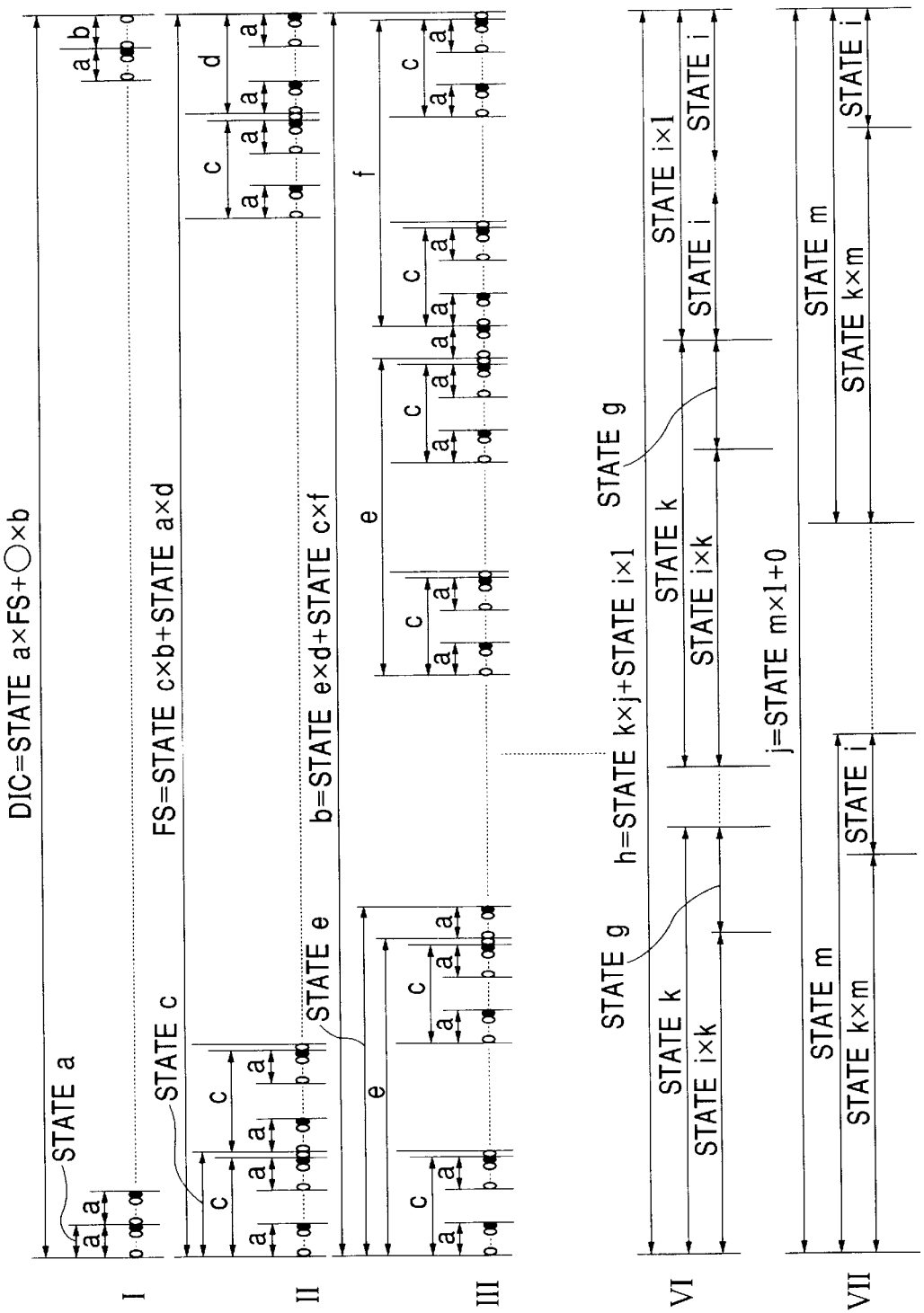
FIG. 17 is a diagram for explaining logical control using Euclidean algorithm operation processing result in FIG. 10.

The state I in FIG. 17 indicates the state that the operation of the expression (a) is performed. The number of ○ is a −1, and the number of ● is 1, i.e., the state I indicates the state that the phase change occurs once at the period of the clock signals Kv of a times (this state is called the state a hereinafter). Then, the state a is repeated FS times, and the state of ○ continues b (the remainder) times.

The state II indicates the state changed from the state I based on the operation result of the expression (b). After repeating the state a in the state I c times, ○ is inserted once (this state is called the state c hereinafter). Then, the state c is repeated b the remainder of the expression (a)) times, and the tate a is repeated d (the remainder of the expression (b)) times.

As well as the state II, the state III indicates the state changed from the state II based on the operation result of the expression (c). After repeating the state c in the state II e times, the state a is inserted once (this state is called the state e hereinafter). Then, the state e is repeated d (the remainder of the expression (b)) times, and the state c is repeated f (the remainder of the expression (c)) times.

In the following states, as described above, the previous state is repeated the number of times equivalent to the quotient by using the quotient of each expression of the Euclidean algorithm operation processing results, and the state of the remainder of the previous expression is inserted one by one. Then, the state that the remainder finally becomes 0, i.e., the state (the state m) that, after repeating the state k in the state VII m times, the state i is inserted once is repeated the number of times equivalent to the remainder 1 of the expression (w).

In the actual logical control, the order of ○ and ● is determined according to the last state VII shown in FIG. 17. For example, if DIC=60 and FS=22 are given, the Euclidean (algorithm) operation processing circuit 8 performs the following operation and then outputs the result thereof to the control logic circuit 7.

(a) 60/22=2 . . . 16
(b) 22/16=1 . . . 6
(c) 16/6=2 . . . 4
(d) 6/4=1 . . . 2
(e) 4/2=2 . . . 0

Figure 18:
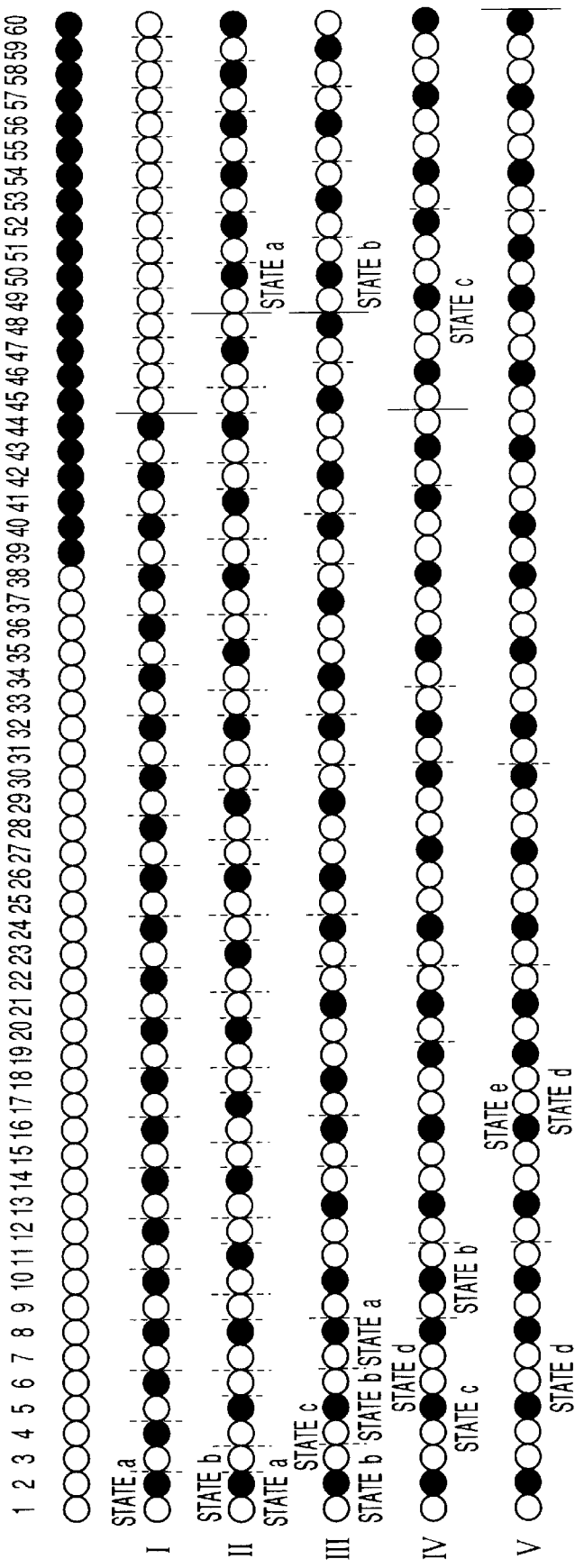
FIG. 18 is a diagram for explaining the logical control in FIG. 17 by way of example.

As shown in FIG. 18, the sum of ○ and ● is 60 (DIC), and the sum of ● is 22 (FS).

As explained above, in the state I, the quotient a of the expression (a) corresponds to 2, and the state a that ○ is 2−1=1 and ● is 1 continues FS (i.e., 22) times, and the state of ○ continues 16 (the remainder) times.

In the state II, the state a is repeated once equivalent to the quotient of the expression (b), and ○ is inserted once. Such the state b is repeated 16 times equivalent to the divisor of the expression (b), and the state a corresponding to the remainder 6 continues.

In the state III, the state b is repeated twice equivalent to the quotient of the expression (c), and the state a is inserted once. Such the state c is repeated 6 times equivalent to the divisor of the expression (c), and the state b corresponding to the remainder 4 continues.

Similarly, in the state IV, the state c is repeated once equivalent to the quotient of the expression (d), and the state b is inserted once. Such the state d is repeated four times equivalent to the divisor of the expression (d), and the state c is repeated twice equivalent to the remainder.

Finally, in the state V, the state d is repeated twice equivalent to the quotient of the expression (e), and the state c is inserted once. Such the state e is repeated twice equivalent to the divisor of the expression (e).

In the actual logical control, phase transition and hold information are output by using the state V, and the logical control circuit can achieve the operation in the last state V by using the quotients of the expressions (a) to (e) and the remainder of the expression (d) (=the divisor of the expression (e)).

Thus, if the operation (the period of the quotient obtained by the previous expression)×(the quotient obtained by the successive expression)+(one-time insertion of the state of the remainder obtained by the previous expression) is repeated by applying the Euclidean algorithm that the remainder obtained by the divide is again divided by the divisor of the previous expression, the phase transition occurs the number of times equivalent to FS while the clocks Kv are generated the number of times equivalent to DIC, its transition timing is dispersed during such the number of times equivalent to DIC, and an ideal dispersion process in a digital process can be achieved.

Thus, since a phase shift operation period can be equally distributed as much as possible, a comparison clock signal phase transition characteristic becomes linear, whereby frequency stability of the output signal can be optimized.

Operation of Frequency Synthesizer

1. In Case of fv=fr

At this time, the frequency setting data FS is set to be 00h, and the logical control circuit 7 forcedly fixes the phase selection signals S1 and S2. At this time, the comparison clock signal Kv has the constant phase, and the frequency synthesizer performs a mere PLL operation to output the clock frequency fv equivalent to the reference clock frequency fr.

2. In Case of Using Frequency Synthesizer Mode

Figure 19:
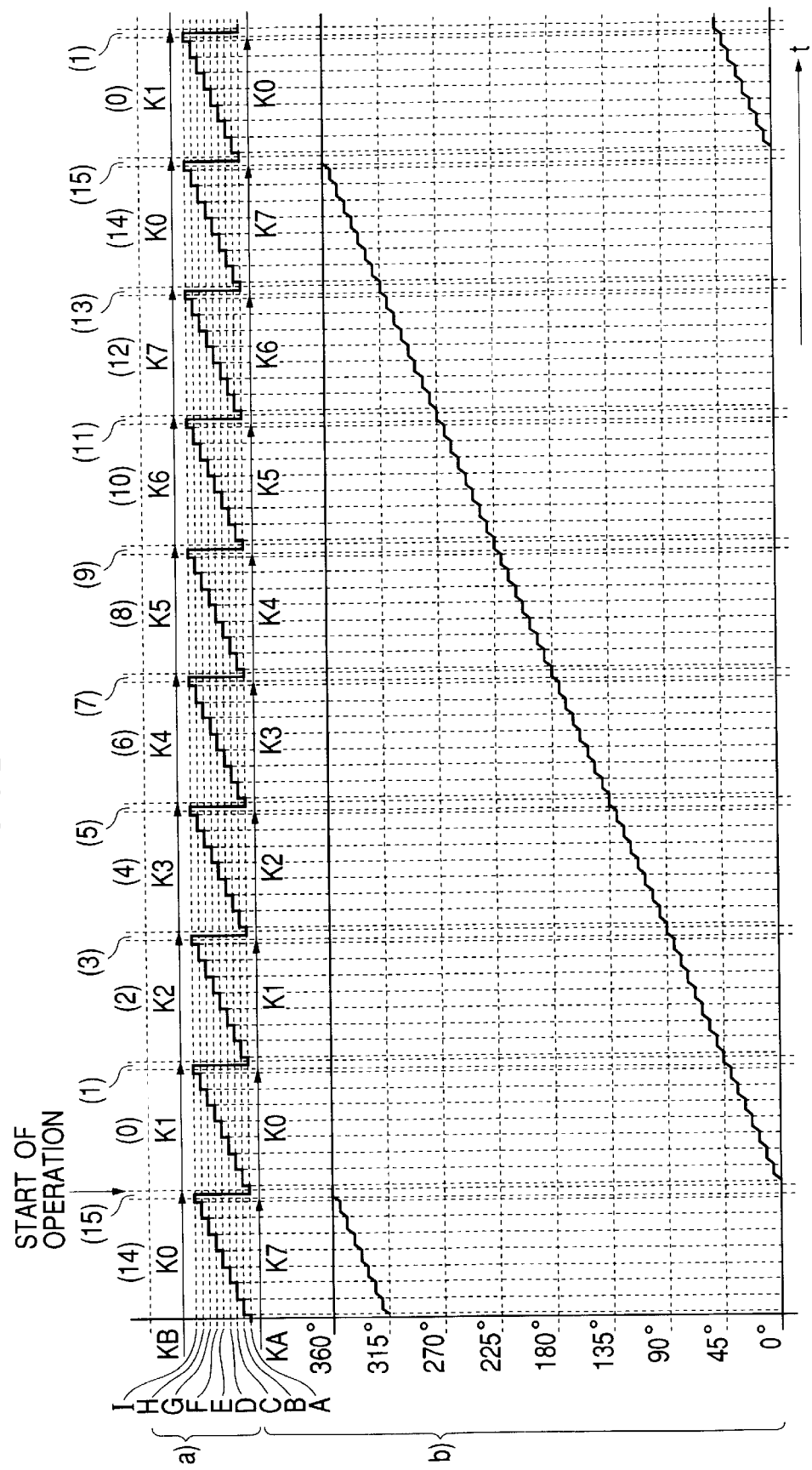
FIG. 19 is a diagram showing a first state for explaining a pre-scaler operation in FIG. 10.
Figure 20:
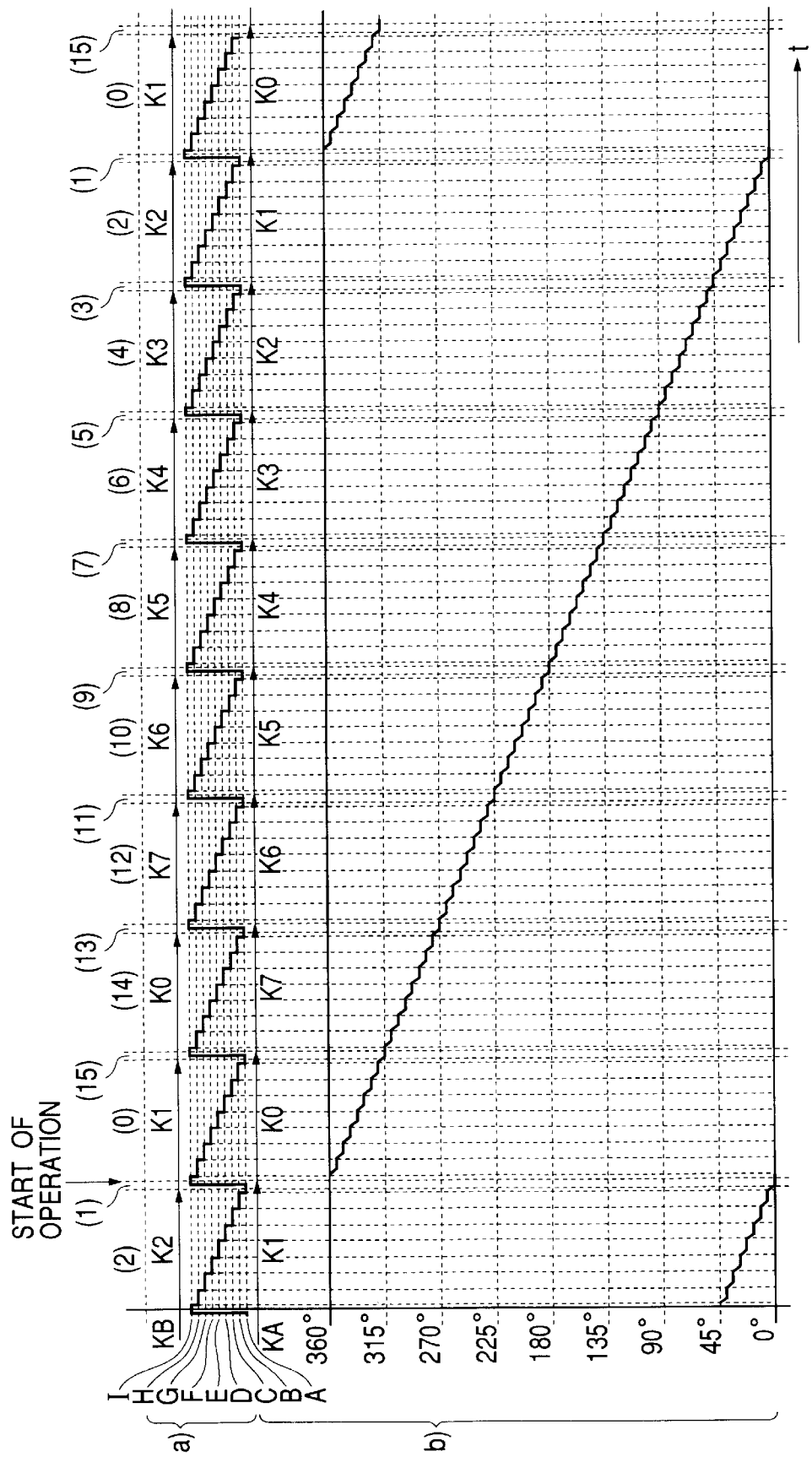
FIG. 20 is a diagram showing a second state for explaining the pre-scaler operation in FIG. 10.

By controlling the selection signals S1 and S2, the phase of the comparison signal can be changed with high accuracy by 1/64 period. FIG. 19 shows a phase delay sequence, a part a) shows the states of the main-phase and sub-phase selection circuits at this time, and a part b) shows the phase change of the comparison clock signal Kv. FIG. 20 shows a phase advance sequence, a part a) shows the states of the main-phase and sub-phase selection circuits at this time, and a part b) shows the phase change of the comparison clock signal Kv.

In FIGS. 19 and 20, the phase shift operation is started from the operation start point by the dispersion process calculated by the Euclidean (algorithm) operation processing circuit in accordance with the values of the DIC and FS.

In Case of direct=H

In FIG. 19, the comparison clock signal Kv is the main-phase selection signal S1 of KB=K1 and KA=K0, and the sub-phase selection signal S2 is in the state A of FIG. 15. If the phase shift signal is input, the signal S2 for determining a next phase state (the signal S1 represents the state same as the previous state) is output, the transition from the state A to the state B of FIG. 15 occurs.

Then, the signal S2 causes the phase transition operation in alphabetical order of FIG. 15 according to the phase shift state. If a next phase shift signal is input in the phase state H, the signal S2 generates a signal to set the phase state I. When the phase state becomes the stationary state, the signal S1 shifts from the state 0 to the state 1 in FIG. 13. Then, when the state becomes the stationary state, the signal S2 shifts from the phase state I to the phase state A.

Then, when the state becomes the stationary state, the signal S1 shifts from the state 1 to the state 2.

That is, the comparison clock signal Kv is in the state K1 during the above-described operations, and the phase transition operation based on the sub-phase selection signal is also performed in the state that the main phase has been shifted (KB=K1, KA=K0→KB=K2, KA=K1). By performing such an operation, the 1/64 period can be continuously shifted.

In Case of direct=L

In FIG. 20, the comparison clock signal Kv is the main-phase selection signal S1 of KB=K1 and KA=K0, and the sub-phase selection signal S2 is in the state I of FIG. 15. If the phase shift signal is input, the signal S2 for determining a next phase state (the signal S1 represents the state same as the previous state) is output, the transition from the state I to the state H of FIG. 15 occurs.

Then, the signal S2 causes the phase transition operation in alphabetical order of FIG. 15 according to the phase shift state. If a next phase shift signal is input in the phase state B, the signal S2 generates a signal to set the phase state A. When the phase state becomes the stationary state, the signal S1 shifts from the state 0 to the state 15 in FIG. 13. Then, when the state becomes the stationary state, the signal S2 shifts from the phase state A to the phase state I. Then, when the state becomes the stationary state, the signal S1 shifts from the state 15 to the state 14.

That is, the comparison clock signal Kv is in the state K0 during those operations, and the phase transition operation based on the sub-phase selection signal is also performed in the state that the main phase has been shifted (KB=K1, KA=K0 → KB=K0, KA=K7). By performing such an operation, the 1/64 period can be continuously shifted.

Frequency Setting

When the phase is delayed by the one period in an N1 clock term, the frequency of an output clock CK becomes higher than the frequency fr of the reference clock signal as shown by the following expression. When direct=H, DIC=FS $$fck = fr \times N1/(N1-1) \quad (5)$$

When the phase is advanced by the one period in the N1 clock term, the frequency of the output clock CK becomes lower than the frequency fr of the reference clock signal as shown by the following expression. When direct=L, DIC=FS $$fck = fr \times N1/(N1+1) \quad (6)$$

When the phase is delayed by the 1/64 period in the N2 clock term, the frequency of the output clock CK becomes higher than the frequency fr of the reference clock signal as shown by the following expression. When direct=H, FS=1

$$fck = fr \times N2/(N2-1/64) \quad (7)$$

When the phase is advanced by the 1/32 period in the N2 clock term, the frequency of the output clock CK becomes lower than the frequency fr of the reference clock signal as shown by the following expression. When direct=L, FS=1

$$fck = fr \times N2/(N2-1/64) \quad (8)$$

Incidentally, the specification of the frequency synthesizer is set, as well as the conventional example, as follows.
frequency variable range: about ±2000 ppm
frequency setting accuracy: about 15 ppm If the term N1 is set as the 512 clock periods according to the expressions (5) and (6) indicating the maximum frequency transition, <maximum frequency variable range: about ±2000 ppm> can be achieved, while if the term N2 is set as the 1024 (2×N1) clock periods according to the expressions (7) and (8) indicating the minimum frequency transition, <frequency setting accuracy: about 15 ppm> can be achieved.

That is, if the phase control of −128/64 (two rotations) to −1/64, 0, +1/64 to +128/64 (two rotations) clock periods is performed based on the frequency setting data DIC and FS in the 1024 clock period term, the output clock frequency can be changed to have a desired value. Positive and negative can be set by the phase change control signal "direct".

To stabilize the operation of the charge pump circuit 2 to secure the frequency stability, as previously explained in the pre-scaler operation, it is desirable to disperse, in an even interval as much as possible, the phase control intervals of the 1/64 periods within the phase control term N2 in each condition.

In FIGS. 19 and 20, each phase control interval has been set to be the same. This means that the phase change speed, i.e., the frequency, is constant, whereby a charge pump voltage can be made constant.

In the frequency synthesizer according to the present embodiment, the phase comparison operation to determine the target output frequency can be performed for each output signal period, whereby the PLL structure circuit which is general as the PLL structure circuit block such as the variable oscillation circuit 6, the charge pump circuit 2 and the like can be used without any modification.

Although the sub-phase selection circuit 4 has been installed to improve the pre-scaler operation, as described above, it is apparent that the pre-scaler operation can be achieved even if the circuit 4 does not exist. In this case, it is necessary to suppress a jump of the control phase by, e.g., increasing the capacity value in the charge pump circuit 2.

Although the multi-phase clock is generated directly by the variable oscillator 6 in the above-described embodiment, the multi-phase clock may be generated as an output signal of a single-phase output variable oscillation circuit by a delay chain circuit in which delay circuits are cascaded.

Although in the above explanation, the comparison clock signal Kv is input to the control logic circuit which generate the signals S1 and S2, the present embodiment is not limited to this because a timing restriction is small in the signals S1 and S2, i.e., the multi-phase clock signals K0 to K7 and the main selection clocks KA and KB can be used instead.

As explained above, according to the present embodiment, the phase comparison operation for controlling the target output signal frequency can be performed for each period of the output signal, and this operation does not relate to the target frequency setting accuracy, whereby a high-accuracy frequency synthesizer function can be achieved by the variable oscillation circuit and the charge pump circuit having the general PLL structure. Further, the circuit can be structured by an LSI and thus concretized with less manufacturing cost. Further, for the increase of the frequency setting accuracy, it is possible to maintain the charge pump always in the steady state by performing the ideal dispersion process in the logic process to which the Euclidean algorithm is applied when the phase transition operation is performed. Thus, since the attack/recovery ability is not spoiled, speedy output frequency change can be performed, whereby the frequency synthesizer according to the present embodiment can be used in a communication field and have a wide application range.

In other words, the foregoing description of the embodiments has been given for illustrative purposes only and not to be construed as imposing any limitation in every respect.

The scope of the invention is, therefore, to be determined solely by the following claims and not limited by the text of the specifications and alterations made within a scope equivalent to the scope of the claims fall within the true spirit and scope of the invention.

What is claimed is:

1. A frequency conversion apparatus which generates an output signal having a frequency equivalent to a coefficient multiple of a frequency of a reference clock signal, said apparatus comprising:
    a) variable oscillation means for generating a group of clock signals having phase differences obtained by dividing substantially equally a period of the output signal;
    b) main-phase selection means for selecting and outputting, from said group of the clock signals, a pair of the two clock signals of desired adjacent phases on the basis of a first control signal;
    c) sub-phase selection means for selecting and outputting, from said pair of the clock signals and a clock phase within the phase difference of these signals, the one clock signal on the basis of a second control signal;
    d) operation processing means for performing an operation process by using two frequency setting data;
    e) logical control means for generating the first and second control signals on the basis of the clock signal selected by said sub-phase selection means, the operation result of said operation processing means, and a phase change control signal;
    f) phase comparison means for outputting a phase difference signal representing a phase difference between the clock signal selected by said sub-phase selection means and the reference clock signal; and
    g) control means for controlling said variable oscillation means on the basis of the phase difference signal output by said phase comparison means.

2. An apparatus according to claim 1, wherein said operation processing means performs a divide of said two frequency setting data, again performs the divide by using the divisor and the remainder of the previous process, and repeats the divide by using the divisor and the remainder of the previous process until the remainder becomes 0.

3. An apparatus according to claim 2, wherein said logical control means generates the control signal by using, in the operation process, the quotient in each operation process and the remainder in the process immediately before the last operation process that the remainder becomes 0.

4. An image formation apparatus for performing output control of input image data by using the frequency conversion apparatus defined in claim 1.

5. An apparatus according to claim 4, wherein said image formation apparatus forms an image by using two beams.

6. An apparatus according to claim 4, wherein said image formation apparatus separates the input image data into plural color component data, and forms an image for each color component data.

7. A frequency conversion method which generates an output signal having a frequency equivalent to a coefficient multiple of a frequency of a reference clock signal, said method comprising:
    a) a variable oscillation step of generating a group of clock signals having phase differences obtained by dividing substantially equally a period of the output signal;
    b) a main-phase selection step of selecting and outputting, from said group of the clock signals, a pair of the two clock signals of desired adjacent phases on the basis of a first control signal;
    c) a sub-phase selection step of selecting and outputting, from said pair of the clock signals and a clock phase within the phase difference of these signals, the one clock signal on the basis of a second control signal;
    d) an operation processing step of performing an operation process by using two frequency setting data;
    e) a logical control step of generating the first and second control signals on the basis of the clock signal selected in said sub-phase selection step, the operation result of said operation processing step, and a phase change control signal;
    f) a phase comparison step of outputting a phase difference signal representing a phase difference between the clock signal selected in said sub-phase selection step and the reference clock signal; and
    g) a control step of controlling the clock signal generation in said variable oscillation step on the basis of the phase difference signal output in said phase comparison step.

8. A method according to claim 7, wherein said operation processing step performs a divide of said two frequency setting data, again performs the divide by using the divisor and the remainder of the previous process, and repeats the divide by using the divisor and the remainder of the previous process until the remainder becomes 0.

9. A method according to claim 8, wherein said logical control step generates the control signal by using, in the operation process, the quotient in each operation process and the remainder in the process immediately before the last operation process that the remainder becomes 0.

10. An image formation method of performing output control of input image data by using a frequency conversion method defined in claim 7.

11. A method according to claim 10, wherein said image formation method forms an image by using two beams.

12. A method according to claim 10, wherein said image formation method separates the input image data into plural color component data, and forms an image for each color component data.

* * * * *